United States Patent [19]
Harada et al.

[11] Patent Number: 5,801,069
[45] Date of Patent: Sep. 1, 1998

[54] METHOD OF FABRICATING THIN FILM PIEZOELECTRIC DEVICE

[75] Inventors: Kenichi Harada; Takeshi Kuragaki; Osamu Ishihara; Kazuhiko Sato; Akiyoshi Kudo, all of Tokyo, Japan

[73] Assignee: Mitsubishi Denki Kabushiki Kaisha, Tokyo, Japan

[21] Appl. No.: 594,769

[22] Filed: Jan. 31, 1996

[30] Foreign Application Priority Data

Sep. 11, 1995 [JP] Japan .................... 7-233065

[51] Int. Cl.⁶ .................................... H01L 21/00
[52] U.S. Cl. ............................ 438/52; 438/53
[58] Field of Search ..................... 438/52–53, 924, 438/970; 29/25.35

[56] References Cited

U.S. PATENT DOCUMENTS

| | | | |
|---|---|---|---|
| 5,202,281 | 4/1993 | Ishibashi | 438/52 |
| 5,395,802 | 3/1995 | Kiyota et al. | 438/52 |
| 5,493,470 | 2/1996 | Zavracky et al. | 361/283.4 |

FOREIGN PATENT DOCUMENTS

| | | |
|---|---|---|
| 60-92672 | 5/1985 | Japan . |
| 3167913 | 7/1991 | Japan . |
| 4192473 | 7/1992 | Japan . |

OTHER PUBLICATIONS

"X–Band Thin Film Acoustic Filters on GaAs" by R.B. Stokes and J.D. Crawford in the 1992 IEEE MTT–S International Microwave Symposium Digest, vol. 1 (edited by D.W. Reid), pp. 157–160.

*Primary Examiner*—Jey Tsai
*Attorney, Agent, or Firm*—Leydig, Voit & Mayer, Ltd.

[57] ABSTRACT

A method of fabricating a thin film piezoelectric device includes preparing a semiconductor substrate having a surface; forming an etch stopping layer having an etching rate on the surface of the semiconductor substrate; forming a first semiconductor layer having an etching rate higher than the etching rate of the etch stopping layer on the etch stopping layer; forming a first electrode on a region of the first semiconductor layer; forming a piezoelectric film on the first electrode; forming a second electrode on the piezoelectric film; and etching a portion of the first semiconductor layer where the first electrode, the piezoelectric film, and the second electrode overlap, from the surface of the first semiconductor layer, selectively with respect to the etch stopping layer, thereby forming a cavity in the first semiconductor layer. Even when a compound semiconductor is employed as the substrate, the etching forming a cavity is stopped at the etch stopping layer in the direction perpendicular to the surface of the first semiconductor layer so that a cavity having a uniform depth is produced with high controllability.

2 Claims, 13 Drawing Sheets

Fig.1 (a)
Fig.1 (b)
Fig.1 (c)
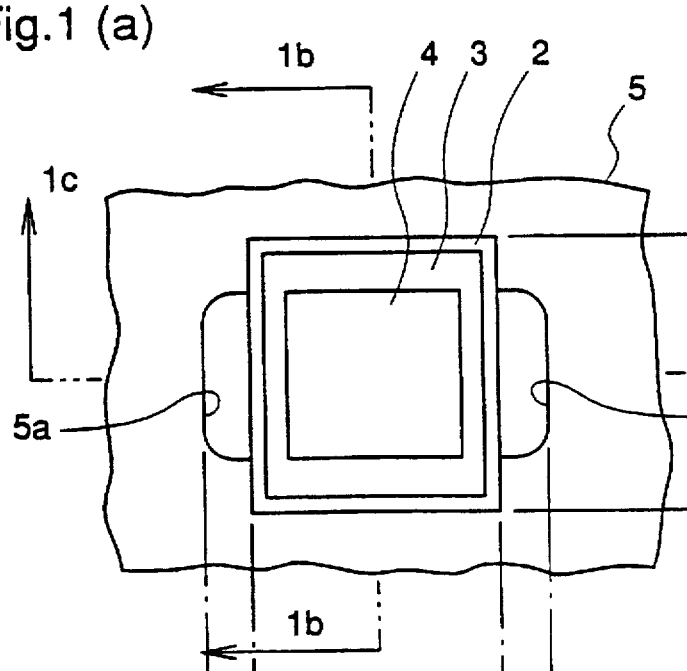
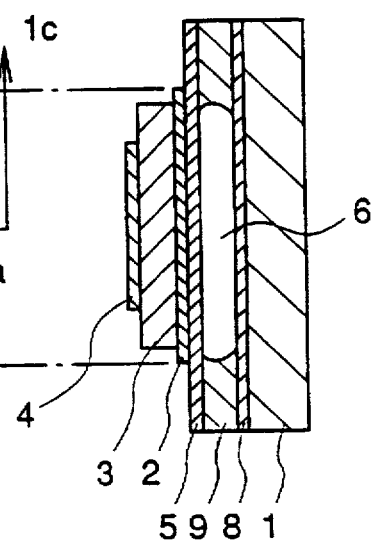
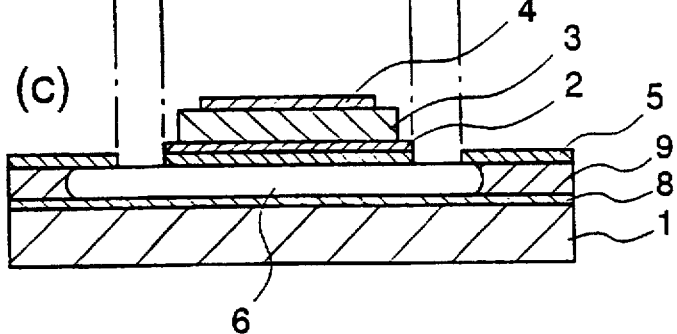

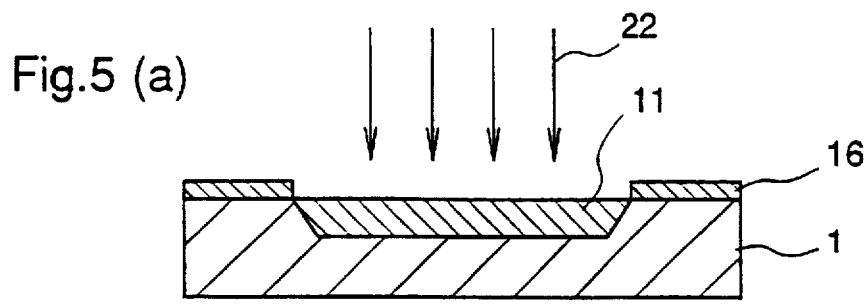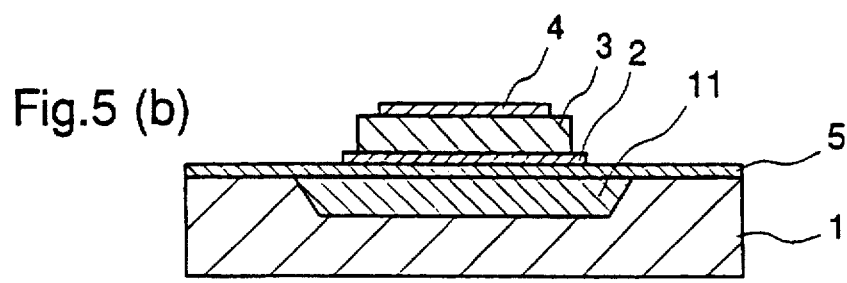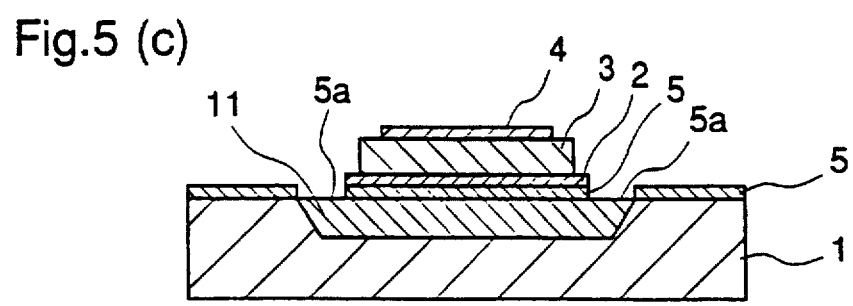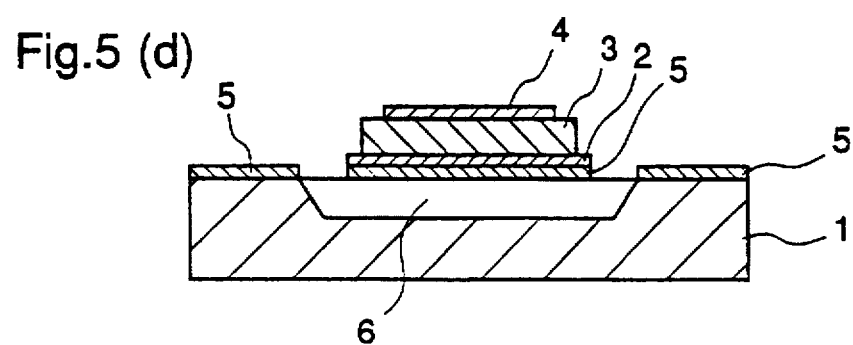

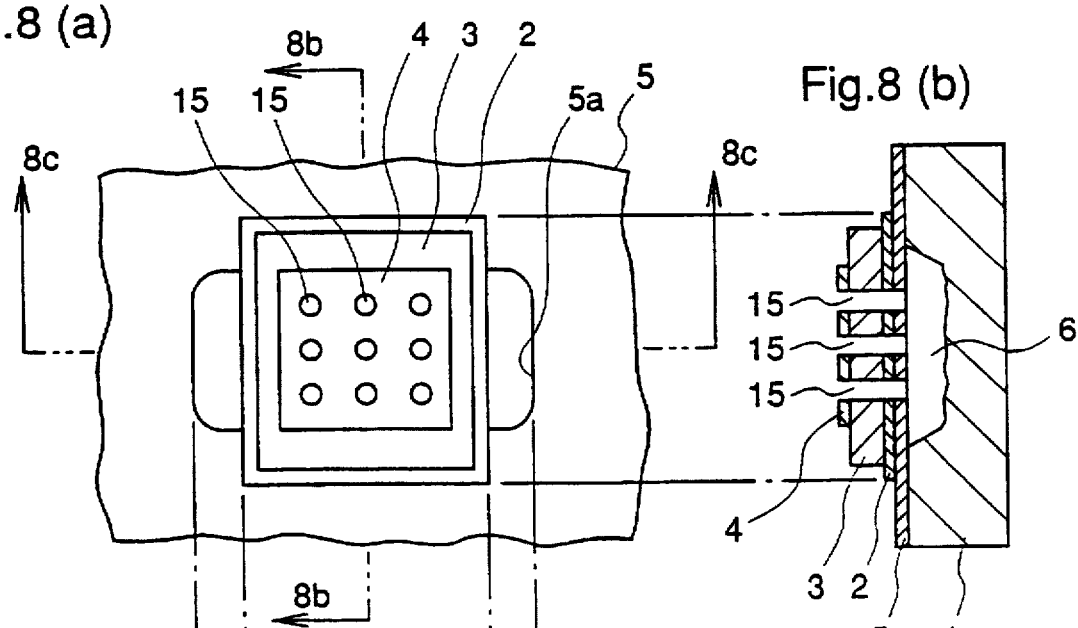
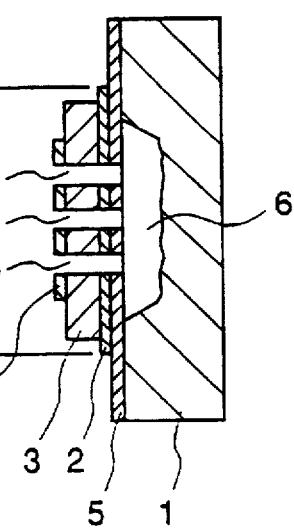
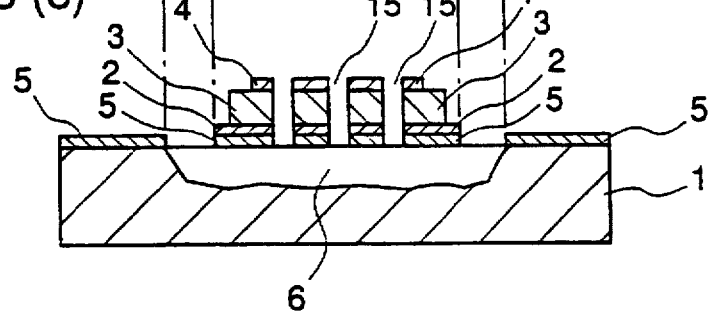

METHOD OF FABRICATING THIN FILM PIEZOELECTRIC DEVICE

FIELD OF THE INVENTION

The present invention relates to a method of fabricating a thin film piezoelectric device used as a resonator or a filter.

BACKGROUND OF THE INVENTION

Thin film piezoelectric devices are used as resonators or filters, taking advantage of piezoelectric material's exchange of an electrical signal for an elastic wave.

FIG. 12 is a cross-sectional view illustrating a prior art thin film piezoelectric device. In the figure, reference numeral 1 designates a semiconductor substrate comprising a semiconductor material, such as GaAs, and having a thickness of about 600 μm. An insulating film 5 comprising silicon dioxide ($SiO_2$) or silicon nitride (SiN) and having a thickness of several hundreds to several thousands of angstroms is disposed on the semiconductor substrate 1. A first electrode 2 is disposed on the insulating film 5. The first electrode 2 has a planar surface of a square shape, 70~120 μm along each side, and a thickness of about 1000 Å. Preferably, the first electrode comprises a lamination of a titanium (Ti) film and a platinum (Pt) film (hereinafter referred to as a Ti/Pt film). A thin piezoelectric film 3 comprising lead titanate ($PbTiO_3$) and having a thickness of about 1 μm is disposed on the first electrode 2. The piezoelectric film 3 may comprise AlN, ZnO, CdS, $LiNbO_3$, or $LiTaO_3$. A second electrode 4 is disposed on the piezoelectric film 3. The second electrode 4 has a planar surface of a square shape, 50~100 μm along each side, and a thickness of about 1000 Å. Preferably, the second electrode 4 comprises a Ti/Pt film. A via-hole 7 penetrates a portion of the semiconductor substrate 1 opposite the second electrode 4.

A description is given of the fabricating process.

Initially, the insulating film 5 is formed on the semiconductor substrate 1 by chemical vapor deposition (CVD) or sputtering. Then, the first electrode 2 is formed on a region of the insulating film 5 by vacuum evaporation or sputtering using a resist mask (not shown). Further, the piezoelectric film 3 and the second electrode 4 are successively formed on the first electrode 2 by vacuum evaporation or sputtering using resist masks (not shown). Finally, a portion of the substrate 1 opposite the second electrode 4 is dry-etched from the rear surface of the substrate 1 until the insulating film 5 is exposed, thereby producing the via-hole 7.

A description is given of the operation of the thin film piezoelectric device when it is used as a filter. Initially, bias current is applied to the first electrode 2 and the second electrode 4. When a.c. modulation is applied across the first electrode 2 and the second electrode 4, the piezoelectric film 3 is distorted in response to the potential difference between the first electrode and the second electrode and produces an elastic wave in response to the power supply frequency. The elastic wave is reflected between the first electrode 2 and the second electrode 4 and resonates, producing a standing wave at a resonant frequency. As a result, only current of the resonant frequency is taken out. The resonant frequency depends on the thickness of the piezoelectric film 3 and does not depend on the area of the electrode.

In this prior art thin film piezoelectric device, when $PbTiO_3$ is employed for the piezoelectric film 3, a filter having a pass band of about 2 GHz is easily fabricated. Further, a semiconductor integrated circuit and the piezoelectric device can be monolithically fabricated.

In order for the piezoelectric film 3 to oscillate at a desired frequency, it is necessary to remove a portion of the substrate 1 at the front surface and beneath the piezoelectric film 3 that is between the first electrode 2 and the second electrode 4. For this purpose, in the prior art piezoelectric device, the via-hole 7 is produced in the substrate 1 opposite the first electrode 2. However, since the substrate 1 must be etched from the rear surface of the substrate 1 to produce the via-hole 7, rear-surface processing is required. Such rear-surface processing complicates the fabricating method and increases the time required for the fabrication, resulting in high costs.

The above-described problems are solved in a prior art thin film piezoelectric device illustrated in FIGS. 13(a)–13(c). FIG. 13(a) is a plan view of the prior art piezoelectric device, and FIGS. 13(b) and 13(c) are cross-sectional views thereof taken along lines 13b—13b and 13c—13c in FIG. 13(a), respectively. In these figures, the same reference numerals as those in FIG. 12 designate the same or corresponding parts. Reference numeral 5a designates openings of the insulating film 5 which are adjacent to opposed sides of the first electrode 2. Reference numeral 6 designates a cavity of the substrate 1 which is located opposite the first electrode 2.

This thin film piezoelectric device is fabricated as follows. Initially, the insulating film 5, the first electrode 2, the piezoelectric film 3, and the second electrode 4 are produced on the semiconductor substrate 1 in the same manner as described for the prior art device shown in FIG. 12. Thereafter, a resist (not shown) having openings at positions adjacent to the first electrode 2 is formed on the substrate using conventional photolithographic techniques. Using the resist as a mask, the openings 5a are formed in the insulating film 5 by RIE (reactive ion etching) or the like. Then, the substrate 1 is etched through the openings 5a by wet etching or isotropic dry-etching, thereby forming the cavity 6. The openings 5a in the insulating film 5 may be formed before the formation of the first electrode 2.

In the method of fabricating the prior art thin film piezoelectric device, as a method for removing a portion of the substrate 1 opposite the first electrode 2, etching of a surface portion of the substrate 1 from its front surface is employed. Therefore, rear-surface processing for producing a via-hole as described for the prior art device shown in FIG. 12 is not necessary. In addition, since the piezoelectric device does not have a via-hole penetrating through the substrate 1, satisfactory strength of the device is ensured.

However, when the substrate 1 is etched from the front surface to produce the cavity 6, since the etching proceeds isotropically, i.e., it proceeds not only in the direction parallel to the front surface of the substrate but also in the direction perpendicular to the front surface, the controllability of the etching is very poor. The poor controllability results in an uneven shape of the cavity 6, especially, uneven depth thereof. Consequently, in the prior art method, a thin film piezoelectric device with desired characteristics cannot be obtained. Furthermore, thin film piezoelectric devices with uniform characteristics cannot be obtained.

Meanwhile, Japanese Published Patent Application No. Sho. 60-92672 discloses a method of fabricating a thin film piezoelectric device for producing a cavity, such as the cavity 6, in the substrate with high controllability.

FIGS. 14(a)–14(d) are cross-sectional views illustrating process steps in the fabricating method. In these figures, reference numeral 101 designates a silicon substrate, numeral 102 designates a silicon nitride film, numeral 103 designates a porous silicon layer, numeral 103a designates a silicon dioxide layer that is produced when the porous silicon layer 103 is oxidized, numeral 104 designates a silicon nitride film, numeral 104a designates an opening of the silicon nitride film 104, numeral 105 designates a first electrode, numeral 106 designates a thin piezoelectric film, numeral 107 designates a second electrode, and numeral 108 designates a cavity.

A description is given of the fabricating method.

Initially, a silicon nitride film 102 is deposited on the silicon substrate 101 and patterned to form a square opening opposite a prescribed region of the substrate 101. Then, the substrate 101 with the silicon nitride film 102 is subjected to anodic treatment in an HF (hydrogen fluoride) solution (20~50%), whereby a porous silicon layer 103 is produced in the silicon substrate 101 from the surface of the silicon substrate exposed in the opening of the silicon nitride film 102 (FIG. 14(a)).

After removal of the silicon nitride film 102, another silicon nitride film 104 is deposited over the entire surface of the substrate 101, and a portion of the silicon nitride film 104 on the porous silicon layer 103 is removed along three sides of the square surface of the porous silicon layer 103. In other words, a U-shaped opening 104a is formed in the silicon nitride film 104 to expose a part of the porous silicon layer 103. Subsequently, the substrate 101 is oxidized in a high-pressure oxidation furnace, whereby the porous silicon layer 103 is changed to a silicon dioxide layer 103a (FIG. 14(b)).

Next, a first electrode 105 is formed on the silicon nitride film 104 including a region on the silicon dioxide layer 103a, and a piezoelectric film 106 and a second electrode 107 are formed on the first electrode 105 in the region on the silicon dioxide layer 103a (FIG. 14(c)).

Finally, the silicon dioxide layer 103a is etched with HF solution through the opening 104a, thereby producing a cavity 108 under the region where the first electrode 105, the piezoelectric film 106, and the second electrode 107 overlap (FIG. 14(d)).

In this method, since the cavity 108 is produced with high controllability, a thin film piezoelectric device having desired characteristics is fabricated with high reproducibility.

In the prior art method of fabricating a thin film piezoelectric device shown in FIGS. 14(a)–14(d), anodic treatment and oxidation are combined to remove a portion of the substrate 101 under the region where the first electrode 105, the piezoelectric film 106, and the second electrode 107 overlap. However, the anodic treatment for making a porous portion in the substrate is only applicable to a silicon substrate, in other words, it is not applicable to substrates of other materials, for example, compound semiconductors. Therefore, this prior art method cannot provide a cavity with a desired shape and a uniform depth in a compound semiconductor substrate with high controllability.

SUMMARY OF THE INVENTION

It is an object of the present invention to provide a method of fabricating a thin film piezoelectric device in which a cavity having a desired shape and a uniform depth can be produced in a compound semiconductor substrate with high controllability.

Other objects and advantages of the invention will become apparent from the detailed description that follows. The detailed description and specific embodiments described are provided only for illustration since various additions and modifications within the scope of the invention will be apparent to those of skill in the art from the detailed description.

According to a first aspect of the present invention, a method of fabricating a thin film piezoelectric device comprises preparing a semiconductor substrate having a surface; forming an etch stopping layer having an etching rate on the surface of the semiconductor substrate; forming a first semiconductor layer having an etching rate higher than the etching rate of the etch stopping layer on the etch stopping layer; forming a first electrode on a prescribed region of the first semiconductor layer; forming a piezoelectric film on the first electrode; forming a second electrode on the piezoelectric film; and etching a portion of the first semiconductor layer under a region where the first electrode, the piezoelectric film, and the second electrode are overlapped, from the surface of the first semiconductor layer and selectively with respect to the etch stopping layer, thereby forming a cavity in the first semiconductor layer. Therefore, even when a compound semiconductor substrate is employed, the etching for forming a cavity can be stopped at the etch stopping layer in the direction perpendicular to the surface of the first semiconductor layer, whereby a cavity having a uniform depth is produced with high controllability.

According to a second aspect of the present invention, a method of fabricating a thin film piezoelectric device comprises preparing a semiconductor substrate having a surface; implanting dopant ions into a region of the semiconductor substrate at the surface, forming an ion-implanted region; forming a first electrode on a portion of the ion-implanted region and on portions of the semiconductor substrate adjacent to that portion of the ion-implanted region; forming a piezoelectric film on the first electrode; forming a second electrode on the piezoelectric film; and etching the ion-implanted region from the surface where the first electrode is not present, selectively with respect to a region of the substrate where the dopant ions are not implanted, thereby forming a cavity in the semiconductor substrate. Therefore, even when a compound semiconductor substrate is employed, a cavity is formed by etching the ion-implanted region selectively with respect to the substrate, whereby a cavity with a desired shape and a uniform depth is produced with high controllability.

According to a third aspect of the present invention, a method of fabricating a thin film piezoelectric device comprises preparing a semiconductor substrate having a surface; diffusing a dopant impurity into a region of the semiconductor substrate at the surface, forming an impurity-diffused region; forming a first electrode on a portion of the impurity-diffused region and on portions of the semiconductor substrate adjacent to that portion of the impurity-diffused region; forming a piezoelectric film on the first electrode; forming a second electrode on the piezoelectric film; and etching the impurity-diffused region from the surface where the first electrode is not present, selectively with respect to a region of the substrate where the dopant impurity is not diffused, thereby forming a cavity in the semiconductor substrate. Therefore, even when a compound semiconductor substrate is employed, a cavity is formed by etching the impurity-diffused region selectively with respect to the substrate, whereby a cavity with a desired shape and a uniform depth is produced with high controllability.

According to a fourth aspect of the present invention, a method of fabricating a thin film piezoelectric device comprises preparing a semiconductor substrate having a surface and an etching rate; etching a portion of the semiconductor substrate from the surface to form a hole; growing a semiconductor layer having an etching rate higher than the etching rate of the semiconductor substrate so that the semiconductor layer is buried in the hole of the substrate; forming a first electrode on a portion of the semiconductor layer and on portions of the semiconductor substrate adjacent to that portion of the semiconductor layer; forming a piezoelectric film on the first electrode; forming a second electrode on the piezoelectric film; and etching the semiconductor layer from the surface where the first electrode is not present, selectively with respect to the semiconductor substrate, thereby producing a cavity in the semiconductor substrate. Therefore, even when a compound semiconductor substrate is employed, a cavity is formed by etching the buried semiconductor layer selectively with respect to the substrate, whereby a cavity with a desired shape and a uniform depth is produced with high controllability.

According to a fifth aspect of the present invention, a method of fabricating a thin film piezoelectric device comprises preparing a semiconductor substrate having a surface; etching a portion of the semiconductor substrate from the surface to form a hole; forming a layer comprising a metal or a metal oxide so that the layer is buried in the hole of the substrate; forming a first electrode on a portion of the buried layer and on portions of the semiconductor substrate adjacent to that portion of the buried layer; forming a piezoelectric film on the first electrode; forming a second electrode on the piezoelectric film; and etching the buried layer from the surface where the first electrode is not present, selectively with respect to the semiconductor substrate, thereby producing a cavity in the semiconductor substrate. Therefore, even when a compound semiconductor substrate is employed, a cavity is formed by etching the buried layer selectively with respect to the substrate, whereby a cavity with a desired shape and a uniform depth is produced with high controllability.

According to a sixth aspect of the present invention, a method of fabricating a thin film piezoelectric device comprises preparing a semiconductor substrate having a surface; forming a first electrode on a portion of the surface of the semiconductor substrate; forming a piezoelectric film on the first electrode; forming a second electrode on the piezoelectric film; forming a plurality of through-holes within a prescribed region of the surface of the second electrode, penetrating through the second electrode, the piezoelectric film, and the first electrode and reaching the surface of the semiconductor substrate; and etching the surface of the semiconductor substrate through the through-holes, thereby forming a cavity in the semiconductor substrate opposite the first electrode. Since the substrate under the first electrode is etched through the through-holes, a cavity is produced in a short time, and the depth of the cavity is made uniform. In addition, since the side etching of the substrate is suppressed, the size of the cavity in the direction parallel to the surface of the substrate is reduced.

According to a seventh aspect of the present invention, a method of fabricating a thin film piezoelectric device comprises preparing a semiconductor substrate having a surface; forming a first electrode on a portion of the surface of the semiconductor substrate; forming a piezoelectric film on the first electrode; forming a second electrode on the piezoelectric film; forming a resist covering a first portion of the surface of the substrate adjacent to the first electrode; etching the semiconductor substrate under the first electrode from a second portion of the surface of the substrate adjacent to the first electrode, the second portion being opposed to the first portion that is covered with the resist; after removal of the resist, detecting that the etching end reaches the first portion of the surface of the substrate. In this method, the completion of the cavity is easily confirmed by detecting that the etching end reaches the first portion of the surface of the substrate.

BRIEF DESCRIPTION OF THE DRAWINGS

FIGS. 1(a)–1(c) are diagrams illustrating a thin film piezoelectric device in accordance with a first embodiment of the present invention.

FIGS. 5(a)–5(d) are cross-sectional views illustrating process steps in a method of fabricating a thin film piezoelectric device according to a third embodiment of the present invention.

FIGS. 8(a)–8(c) are diagrams illustrating a thin film piezoelectric device in accordance with a sixth embodiment of the present invention.

DETAILED DESCRIPTION OF THE PREFERRED EMBODIMENTS

Embodiment 1

Figure 2:
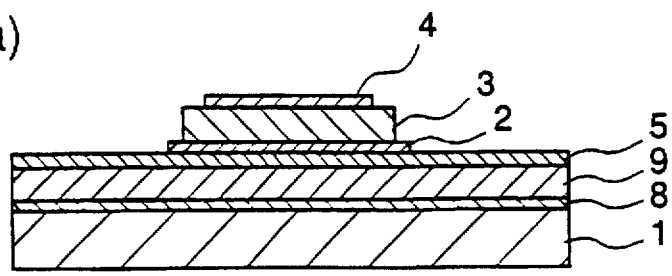
FIGS. 2(a)–2(c) are cross-sectional views illustrating process steps in a method of fabricating the thin film piezoelectric device according to the first embodiment of the invention.
Figure 2:
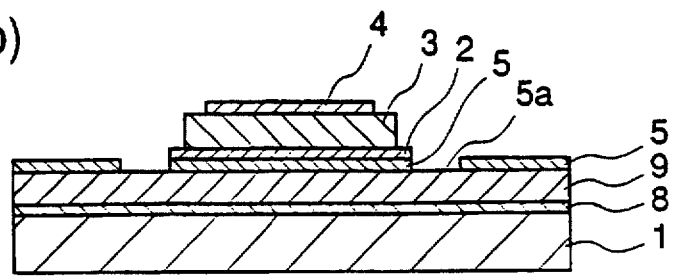
Figure 2:
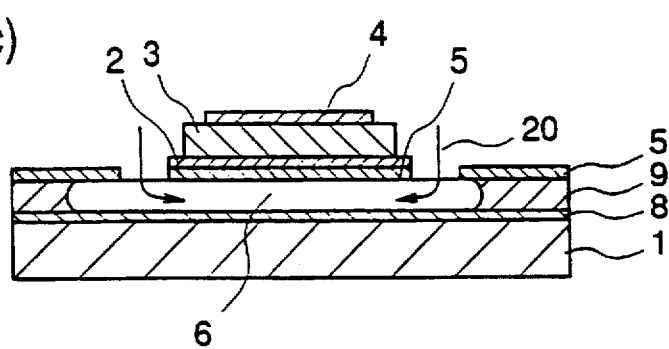

FIG. 1(a) is a plan view illustrating a thin film piezoelectric device according to a first embodiment of the present invention, and FIGS. 1(b) and 1(c) are cross-sectional views of the device taken along lines 1b—1b and 1c—1c in FIG.

1(a), respectively. In these figures, reference numeral 1 designates a semiconductor substrate about 600 μm thick. An etch stopping layer 8 having a thickness in a range from several tens of angstroms to several hundreds of angstroms is disposed on the semiconductor substrate 1. A first semiconductor layer 9 having a thickness in a range from 1000 angstroms to several microns is disposed on the etch stopping layer 8. The etching rate of the first semiconductor layer 9 by a prescribed etching technique is higher than the etching rate of the etch stopping layer 8 by that etching technique. In this first embodiment, GaAs is employed as a material of the substrate 1 and the first semiconductor layer 9, and InGaAs or AlGaAs is employed as a material of the etch stopping layer 8. An insulating film 5 comprising $SiO_2$ or SiN and having a thickness in a range from several hundreds of angstroms to several thousands of angstroms is disposed on the first semiconductor layer 9. A first electrode 2 is disposed on the insulating film 5. The first electrode 2 has a planar surface of a square shape, 70~120 μm along each side, and a thickness of about 1000 Å. Preferably, the first electrode 2 comprises a Ti/Pt film. A piezoelectric film 3 comprising $PbTiO_3$ and having a thickness of about 1 μm is disposed on the first electrode 2. The piezoelectric film 3 may comprise AlN, ZnO, CdS, $LiNbO_3$, or $LiTaO_3$. A second electrode 4 is disposed on the piezoelectric layer 3. The second electrode 4 has a planar surface of a square shape, 50~100 μm along each side, and a thickness of about 1000 Å. Preferably, the second electrode 4 comprises a Ti/Pt film. The insulating film 5 has two openings 5a adjacent to the first electrode 1. The insulating film 5 is arranged to prevent surface degradation of the substrate 1, but this insulating film 5 may be dispensed with. A cavity 6 is produced in the first semiconductor layer 9 under the region where the first electrode 2, the piezoelectric film 3, and the second electrode 4 are overlap.

FIGS. 2(a)–2(c) are cross-sectional views illustrating process steps in a method of fabricating the thin film piezoelectric device according to this first embodiment of the present invention. In the figures, the same reference numerals as those in FIGS. 1(a)–1(c) designate the same or corresponding parts. Reference numeral 20 denotes etching.

A description is given of the fabricating process. Initially, the etch stopping layer 8 and the first semiconductor layer 9 are grown on the semiconductor substrate 1 by MOCVD or other methods of epitaxial growth, and the insulating film 5 is deposited on the first semiconductor layer 9 by CVD or sputtering. Then, the first electrode 2 is formed on a prescribed region of the insulating film 5 by vacuum evaporation or sputtering, and the piezoelectric film 3 and the second electrode 4 are successively deposited on the first electrode 2 using vacuum evaporation or sputtering (FIG. 2(a)).

Next, the insulating film 5, the first electrode 2, the piezoelectric film 3, and the second electrode 4 are covered with a resist (not shown), and portions of the resist adjacent to the first electrode 2 are removed using conventional photolithographic techniques. Using the resist as a mask, the insulating film 5 is etched by RIE to form the openings 5a in the insulating film 5 (FIG. 2(b)). In this first embodiment of the invention, the openings 5a are formed in two regions that are opposed each other with the first electrode 2 between the regions. The openings 5a may be formed immediately after the deposition of the insulating film 5.

After removal of the resist, using the insulating film 5 as a mask for selective etching, a portion of the first semiconductor layer 9 is etched and removed through the openings 5a to produce the cavity 6, thereby completing the piezoelectric device (FIG. 2(c)). For the selective etching of the semiconductor layer 9, an etching technique that does not etch the etch stopping layer 8 but etches the first semiconductor layer 9 with high selectivity is employed. For example, wet etching using a mixture of tartaric acid and hydrogen peroxide in an appropriate ratio or dry etching, such as ECR (Electron Cyclotron Resonance) etching or RIE, for which etching conditions are adjusted to perform isotropic etching, is applicable. In this etching process, since the etch stopping layer 8 having a low etching rate is present in the direction perpendicular to the surface of the first semiconductor layer 9 (hereinafter called depth direction of etching), the etching in the depth direction is stopped at the etch stopping layer 8. If a piezoelectric device that does not include the insulating film 5 is desired, in the etching process of the first semiconductor layer 9, portions of the first semiconductor layer 9 which should not be etched are masked with a resist or the like.

A description is given of the operation of the thin film piezoelectric device. Initially, a bias voltage is applied to the first electrode 2 and the second electrode 4. When a.c. modulation is applied across the first electrode 2 and the second electrode 4, the piezoelectric film 3 is distorted in response to the potential difference between the first electrode and the second electrode and produces an elastic wave in response to the a.c. modulation. The elastic wave is reflected between the first electrode 2 and the second electrode 4 and resonates, producing a standing wave at a prescribed resonant frequency. As a result, only current at the prescribed frequency is taken out.

In the method of fabricating the thin film piezoelectric device according to this first embodiment, the etch stopping layer 8 and the first semiconductor layer 9 are disposed on the semiconductor substrate 1 in this order, and the cavity 6 is produced by etching the first semiconductor layer 9 through the openings 5a of the insulating film 5. Although the etching proceeds at the same etching rate both perpendicular and parallel to the surface of the first semiconductor layer 9, since the etch stopping layer 8 is present under the first semiconductor layer 9, the etching in the perpendicular direction stops at the etch stopping layer 8. After the etching front reaches the etch stopping layer 8, the etching proceeds only in the parallel direction to the surface of the substrate 1. As a result, an etching having a high controllability in the depth direction with respect to the first semiconductor layer 9 under the first electrode 2 is performed. Therefore, a cavity 6 with a desired shape and a uniform depth is produced by appropriately selecting the thickness of the first semiconductor layer 9.

When the first semiconductor layer 9 is etched in the direction parallel to the surface of the substrate 1, the etching proceeds in a region under the first electrode 2 as well as in a region other than the region under the first electrode 2. Therefore, the size and the positions of the openings 5a of the insulating film 5 must be selected so that the cavity 6 is produced in the region of the first semiconductor layer 1 in the proximity of the first electrode 2.

Furthermore, the first semiconductor layer 9 serving as a part of the substrate 1 of the thin film piezoelectric device may comprise a compound semiconductor, such as GaAs, or silicon. In either case, the cavity 6 is produced in the first semiconductor layer 9 with high controllability in the depth direction when an etch stopping layer 8 having an etching rate different from the etching rate of the first semiconductor layer 9 is disposed under the first semiconductor layer 9.

As described above, in the fabricating method of the thin film piezoelectric device according to the first embodiment of the invention, initially, the etch stopping layer 8 and the first semiconductor layer 9 that has an etching rate higher than the etching rate of the etch stopping layer 8 are formed on the semiconductor substrate 1, and the insulating film 5 is formed on the first semiconductor layer 9. Then, the first electrode 2, the piezoelectric film 3, and the second electrode 4 are formed on a region of the insulating film 5 in this order, and the openings 5a are formed in portions of the insulating film 5 adjacent to the first electrode 2, followed by etching of the first semiconductor layer 9 through the openings 5a of the insulating film 5, thereby producing the cavity 6. Therefore, even when the first semiconductor layer 9 that serves as a part of the substrate of the piezoelectric device comprises a compound semiconductor, a cavity 6 having a desired shape and a uniform depth is produced in the first semiconductor layer 9 with high controllability.

Embodiment 2

Figure 3:
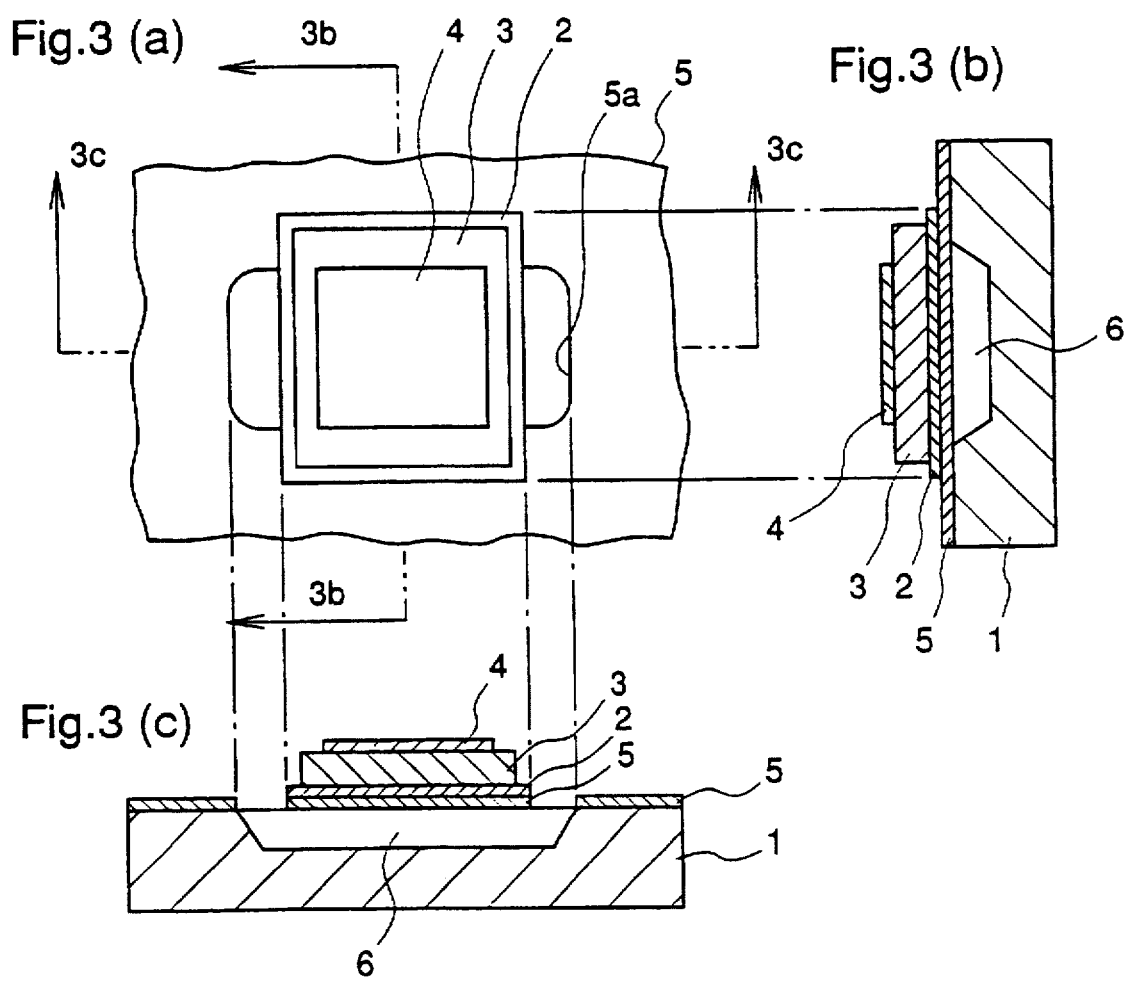
FIGS. 3(a)–3(c) are diagrams illustrating a thin film piezoelectric device in accordance with a second embodiment of the present invention.

FIG. 3(a) is a plan view illustrating a thin film piezoelectric device according to a second embodiment of the present invention, and FIGS. 3(b) and 3(c) are cross-sectional views of the device taken along lines 3b—3b and 3c3c in FIG. 3(a), respectively. In these figures, the same reference numerals as those in FIGS. 1(a)-1(c) designate the same or corresponding parts.

FIGS. 4(a)-4(d) are cross-sectional views illustrating process steps in a method of fabricating the thin film piezoelectric device shown in FIGS. 3(a)-3(c). In these figures, the same reference numerals as those in FIGS. 2(a)-2(c) designate the same or corresponding parts. Reference numeral 10 designates an ion-implanted region, numeral 13 designates a resist, and numeral 21 designates ion implantation.

While in the first embodiment the shape of the cavity 6 is controlled by the etch stopping layer and the first semiconductor layer 9, in this second embodiment ions are implanted into a region of the substrate 1 where the cavity 6 is later produced to provide a difference in etching rates between the ion-impltanted region and a region where ions are not implanted, and the ion-implanted region is selectively etched and removed to form the cavity 6.

The fabricating method will be described in more detail.

Figure 4:
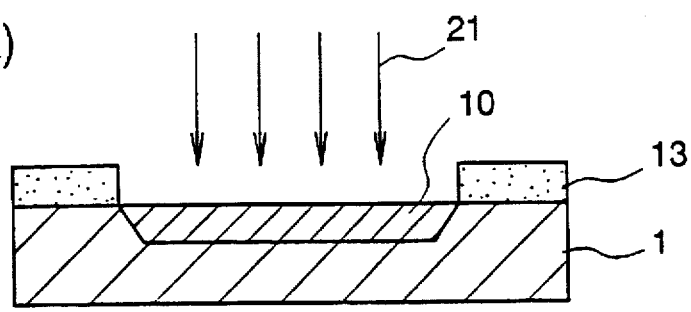
FIGS. 4(a)–4(d) are cross-sectional views illustrating process steps in a method of fabricating the thin film piezoelectric device according to the second embodiment of the invention.
Figure 4:
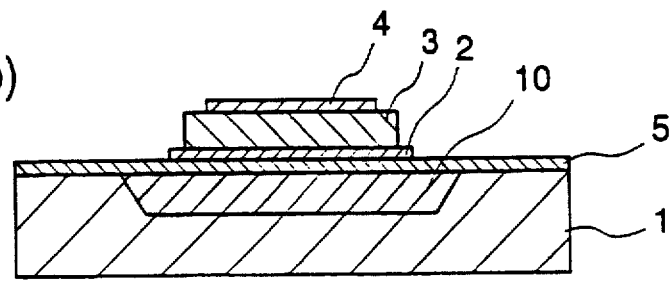
Figure 4:
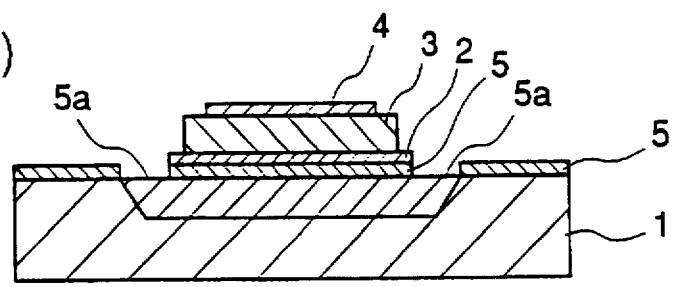
Figure 4:
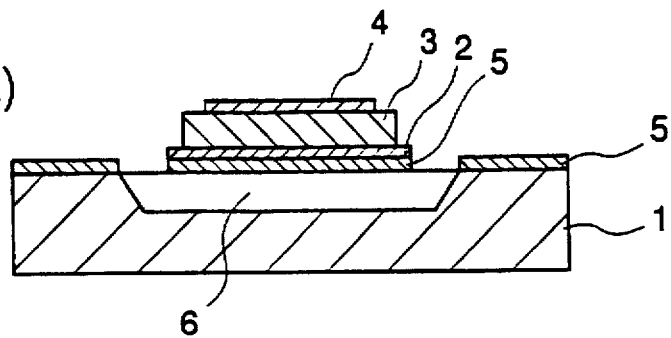

First of all, as illustrated in FIG. 4(a), a resist 13 is applied to the surface of the substrate 1 and patterned to form an opening, opposite a region of the substrate 1 where a cavity 6 is later produced, using conventional photolithographic techniques. Using the resist pattern 13 as a mask, ions are implanted into the substrate 1 in the direction perpendicular to the surface of the substrate 1 as shown by the arrows 21, producing an ion-implanted region 10. Preferably, Ar ions, B ions, H ions, or O ions are implanted. This ion implantation is carried out in several steps at different energies ranging from several tens of keV to several hundreds of keV until the total dose exceeds $10_{15}$ cm$^{-2}$. The depth of the ion implantation is equivalent to a desired depth of the cavity 6, for example, about 0.5 μm.

After removal of the resist 13, an insulating film 5 is formed on the surface of the substrate 1, and a first electrode 2 is formed on a part of the insulating film 5 in a region including the ion-implanted region 10, preferably by sputtering. Further, a piezoelectric film 3 and a second electrode 4 are successively formed on the first electrode 2 opposite the ion implanted region 10, preferably by sputtering (FIG. 4(b)). The first electrode 2 should be absent from a portion of the ion-implanted region 10. In this second embodiment, the first electrode 2 is formed across the ion-implanted region 10 in a prescribed direction so that it does not completely cover the ion implanted region 10 at opposite sides of the region 10 perpendicular to the prescribed direction.

Next, using a resist (not shown) patterned by conventional photolithographic techniques as a mask, portions of the insulating film 5 on the ion-implanted region 10 which are not covered with the first electrode 2 are removed by RIE, thereby forming openings 5a (FIG. 4(c)). The openings 5a may be formed immediately after the formation of the insulating film 5.

After removal of the resist, using the insulating film 5 as a mask, the substrate 1 is wet-etched with a mixture of tartaric acid and hydrogen peroxide to remove a surface portion of the substrate 1 under the region where the second electrode 4, the piezoelectric film 3, and the first electrode 2 overlap. As a result of the etching, a cavity 6 is produced (FIG. 4(d)).

In this second embodiment of the invention, since crystalline defects are produced in the ion-implanted region 10 of the substrate 1, the etching rate of the ion-implanted region is different from the etching rate of a region where ions are not implanted. Therefore, when the substrate is subjected to wet etching using an etchant with appropriate selectivity, the ion-implanted region 10 is etched selectively with respect to a region of the substrate where ions are not implanted. For example, when the substrate 1 comprises GaAs, a mixture of tartaric acid and hydrogen peroxide is used as the etchant and the etching conditions, such as the mixture of the etchant, are adjusted, whereby only the ion implanted region 10 is etched and removed with high controllability. Therefore, in this second embodiment, it is possible to control the etching both in the depth direction and in the direction that is parallel to the surface of the substrate 1 whereas the etching is controlled only in the depth direction in the first embodiment.

The etchant employed for the etching of the ion-implanted region 10 is not restricted to the above-described etchant. Any etchant may be employed as long as it has a high selectivity for the ion-implanted region 10 with respect to the region of the substrate where ions are not implanted. Likewise, any etching technique, for example, dry etching, may be employed as long as it can etch the ion-implanted region 10 selectively with respect to the region where ions are not implanted.

Furthermore, in this second embodiment of the invention, the ion-implanted region 10 is formed in a portion of the substrate 1 at the front surface to provide a difference in etching rates between the ion-implanted region and a region where ions are not implanted, and the selective etching of the ion-implanted region 10 is performed using the difference in the etching rates. Therefore, it is possible to produce the cavity 6 with high controllability whether the semiconductor substrate 1 in which the cavity 6 is produced comprises a compound semiconductor, such as GaAs, or silicon.

As described above, according to this second embodiment of the invention, the ion-implanted region 10 is produced in a region of the substrate 1 where the cavity 6 is later produced and, after the formation of the first electrode 2, the piezoelectric film 3, and the second electrode 4, the ion-implanted region 10 is selectively etched and removed to produce the cavity 6. In this method, the advance of the etching can be controlled both in the direction perpendicular to the surface of the substrate 1 and in the direction parallel to the surface of the substrate 1, whereby the substrate 1 is etched with high controllability. Therefore, even when a compound semiconductor substrate is employed, a thin film piezoelectric device including a cavity of a desired shape and a uniform depth is obtained.

Embodiment 3

FIGS. 5(a)–5(d) are cross-sectional views illustrating process steps in a method of fabricating a thin film piezoelectric device in accordance with a third embodiment of the present invention. In these figures, the same reference numerals as those in FIGS. 4(a)–4(d) designate the same or corresponding parts. Reference numeral 22 designates impurity diffusion and numeral 11 designates an impurity-diffused region.

While in the second embodiment the ion-implanted region 10 is produced in a region of the substrate 1 where the cavity 6 is later produced, in this third embodiment an impurity-diffused region 11 is produced in place of the ion-implanted region 10, and the impurity-diffused region 11 is selectively etched to produce the cavity 6.

The fabricating method will be described in more detail. First of all, as illustrated in FIG. 5(a), an insulating film 16, such as SiN, is deposited on the surface of the substrate 1 and patterned to form an opening opposite a region of the substrate where a cavity 6 is later produced. Using the insulating film pattern 16 as a mask, a gas containing a dopant impurity, such as Zn, is applied to the surface of the substrate 1 as shown by the arrows 22 to diffuse the impurity into the substrate 1, thereby producing an impurity-diffused region 11. The diffusion depth is in a range from about 0.5 micron to several microns. In place of the vapor phase diffusion using the impurity-containing gas, a solid phase diffusion may be employed. In this case, initially, a ZnO film and an SiO$_2$ film are sputtered in this order on a region of the substrate where diffusion of the impurity (Zn) is required and, thereafter, the substrate 1 is maintained at about 600° C. for 1~10 hours to diffuse the impurity into the substrate 1.

After removal of the diffusion mask 16, as in the second embodiment, an insulating film 5 is formed on the surface of the substrate 1, and a first electrode 2, a piezoelectric film 3, and a second electrode 4 are successively formed on the insulating film 5 by sputtering or vacuum evaporation (FIG. 5(b)). Thereafter, portions of the insulating film 5 which are opposed to the impurity-diffused region 11 and are not covered with the first electrode 2 are removed by RIE, thereby forming openings 5a (FIG. 5(c)). Finally, the impurity-diffused region 11 is etched from the surface exposed in the openings 5a by RIE, whereby the impurity-diffused region 11 is selectively removed and a cavity 6 is produced (FIG. 5(d)). In the selective etching, the same etchant as used in the second embodiment is employed. That is, when t he substrate 1 comprises GaAs, a mixture of tartaric acid and hydrogen peroxide is employed.

In this third embodiment of the invention, since crystalline defects are produced in the impurity-diffused region 11 of the substrate 1, the etching rate of the impurity-diffused region 11 is different from the etching rate of a region where the impurity is not diffused (hereinafter referred to as impurity-undiffused region). Therefore, when the substrate is subjected to wet etching using an etchant with appropriate selectivity, the impurity-diffused region 11 is etched selectively with respect to the impurity-undiffused region. The etching technique is not restricted to RIE. Any etching technique, for example, dry etching, may be employed as long as it can etch the impurity-diffused region 11 selectively with respect to the other region of the substrate.

Furthermore, in this third embodiment of the invention, the impurity-diffused region 11 is formed in a portion of the substrate 1 at the front surface to provide a difference in etching rates between the impurity-diffused region 11 and the impurity-undiffused region, and the selective etching of the impurity-diffused region 11 is performed using the difference in the etching rates. Therefore, it is possible to produce the cavity 6 with high controllability whether the semiconductor substrate 1 in which the cavity 6 is produced comprises a compound semiconductor, such as GaAs, or silicon.

As described above, according to this third embodiment of the invention, the impurity-diffused region 11 is produced in a region of the substrate 1 where the cavity 6 is later produced and, after the formation of the first electrode 2, the piezoelectric film 3, and the second electrode 4, the impurity-diffused region 11 is selectively etched and removed to produce the cavity 6. In this method, the advance of the etching can be controlled both in the direction perpendicular to the surface of the substrate 1 and in the direction parallel to the surface of the substrate 1. Therefore, even when a compound semiconductor substrate is employed, the substrate is etched with high controllability, whereby a thin film piezoelectric device including a cavity of a desired shape and a uniform depth is obtained.

Embodiment 4

FIGS. 6(a)–6(f) are cross-sectional views illustrating process steps in a method of fabricating a thin film piezoelectric device in accordance with a fourth embodiment of the present invention. In these figures, the same reference numerals as those in FIGS. 4(a)–4(d) designate the same or corresponding parts. Reference numeral 17 designates a mask for selective growth comprising SiN, numeral 12 designates a buried semiconductor layer comprising a semiconductor material that is etched by an etchant that does not etch the substrate 1, and numeral 25 designates a recess.

While in the second embodiment the ion-implanted region 10 is produced in a region of the substrate 1 where the cavity 6 is later produced, in this fourth embodiment a portion of the substrate where the cavity 6 is later produced is etched and a semiconductor layer 12 fills in the recess produced by the etching. After formation of the first electrode 2, the piezoelectric film 3, and the second electrode 4, the semiconductor layer 12 is selectively etched with respect to the substrate 1 to produce the cavity 6.

Figure 6:
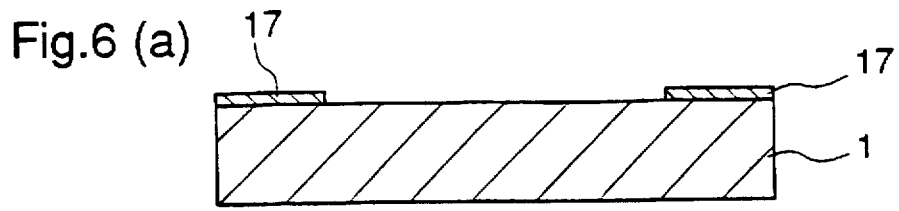
FIGS. 6(a)–6(f) are cross-sectional views illustrating process steps in a method of fabricating a thin film piezoelectric device according to a fourth embodiment of the present invention.
Figure 6:
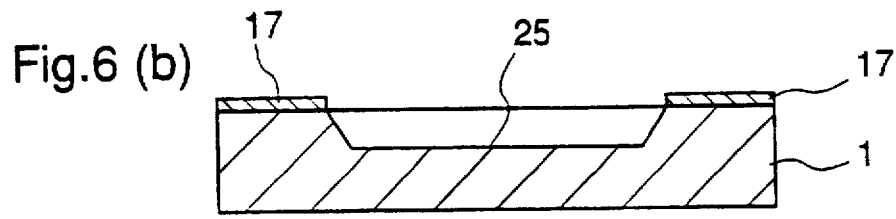
Figure 6:
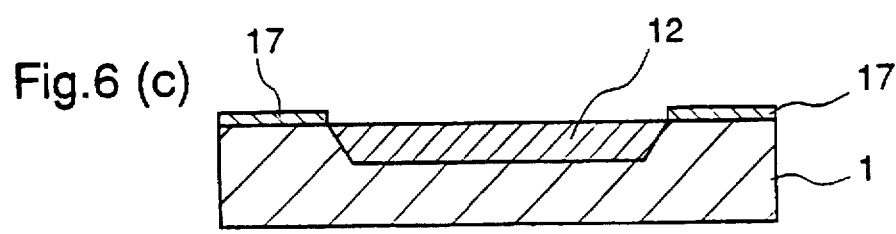
Figure 6:
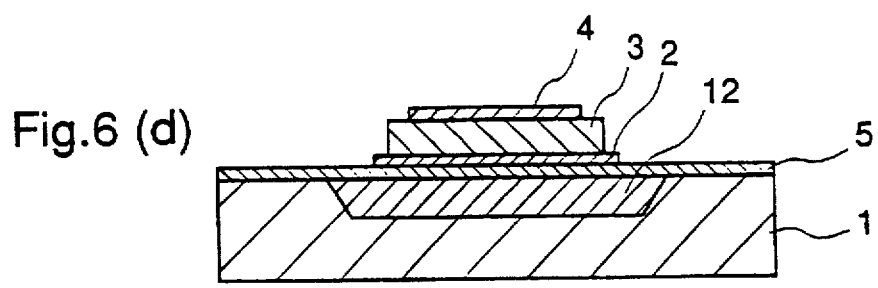
Figure 6:
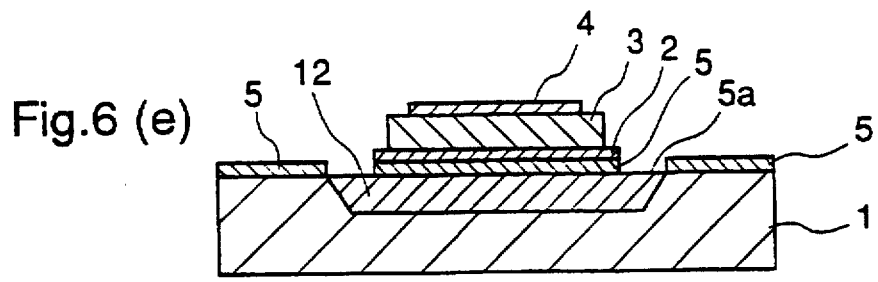
Figure 6:
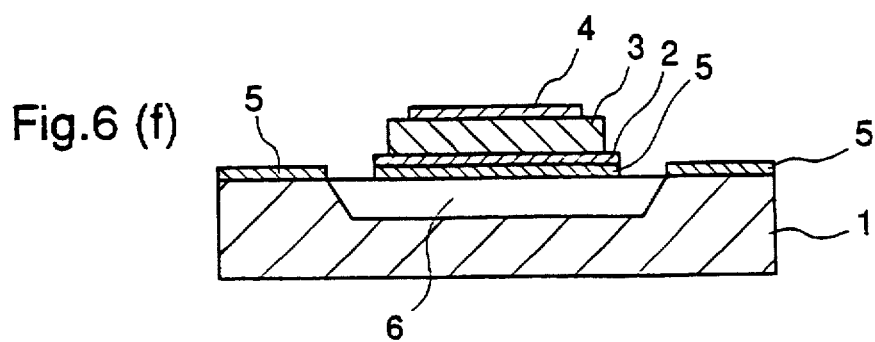

The fabricating method will be described in more detail. Initially, as illustrated in FIG. 6(a), a mask 17 for selective growth (hereinafter referred to as selective growth mask) having an opening opposite a region where a cavity 6 is later produced is formed on the surface of the substrate 1. Then, the substrate 1 is etched through the opening of the mask 17 to produce a recess 25 having a depth in a range from about 0.5 micron to several microns (FIG. 6(b)). The etching is carried out so that the bottom surface of the recess 25 has good morphology. Thereafter, using the selective growth mask 17, a semiconductor layer 12 is grown on the substrate 1, preferably by MOCVD, so that the recess 25 is filled with the semiconductor layer 12, in other words, the semiconductor layer 12 is buried in the substrate 1 (FIG. 6(c)). No crystal growth occurs on the selective growth mask 17.

After removal of the selective growth mask 17, as in the second embodiment of the invention, an insulating film 5 is formed on the surface of the substrate 1 including the buried semiconductor layer 12, and a first electrode 2, a piezoelectric film 3, and a second electrode 4 are successively formed on the insulating film 5 by sputtering or vacuum evaporation (FIG. 6(d)). Thereafter, portions of the insulating film 5 which are opposed to the buried semiconductor layer 12 and are not covered with the first electrode 2 are removed by RIE, thereby forming openings 5a (FIG. 6(e)). Finally, the buried semiconductor layer 12 is etched from the surface exposed in the openings 5a, whereby the buried semiconductor layer 12 is selectively removed and a cavity 6 is produced (FIG. 6(f)).

In this fourth embodiment of the invention, since the semiconductor layer 12 comprising a semiconductor material having an etching rate different from the etching rate of the substrate 1 is buried in a region of the substrate 1 where the cavity 6 is later produced, when wet etching using an etchant with appropriate selectivity is performed, the buried semiconductor layer 12 is etched selectively with respect to the substrate 1. For example, when the substrate 1 comprises GaAs, a buried semiconductor layer 12 comprising AlGaAs or InGaAs can be selectively etched with an HCl based etchant. However, if the piezoelectric film 3 comprises PbTiO$_3$, since the HCl based etchant etches PbTiO$_3$, exposed portions of the piezoelectric film 3 must be covered with a resist or the like. Alternatively, a buried semiconductor layer 12 comprising AlGaInP can be selectively etched with respect to a GaAs substrate using a sulfuric acid (H$_2$SO$_4$) based etchant. Although wet etching is employed in this embodiment, dry etching may be employed as long as it can etch the buried semiconductor layer 12 selectively with respective to the semiconductor substrate 1.

Furthermore, in this fourth embodiment of the invention, since the semiconductor layer 12 having an etching rate different from the etching rate of the substrate 1 is buried in a surface region of the substrate 1 and this semiconductor layer 12 is selectively etched with respect to the substrate, the cavity 6 is produced with high controllability in either case where the semiconductor substrate 1 in which the cavity 6 is produced comprises a compound semiconductor, such as GaAs, or silicon.

As described above, according to this fourth embodiment of the invention, a portion of the substrate 1 where the cavity 6 is later produced is etched to produce the hole 25, and the semiconductor layer 12 fills in the recess 25. After formation of the first electrode 2, the piezoelectric film 3, and the second electrode 4, the semiconductor layer 12 is selectively etched and removed with respect to the substrate 1. Therefore, even when a compound semiconductor substrate is employed, the substrate is etched with high controllability, whereby a thin film piezoelectric device including a cavity of a desired shape and a uniform depth is obtained.

Embodiment 5

FIGS. 7(a)–7(f) are cross-sectional views illustrating process steps in a method of fabricating a thin film piezoelectric device in accordance with a fifth embodiment of the present invention. In the figures, the same reference numerals as those in FIGS. 6(a)–6(f) designate the same or corresponding parts. Reference numeral 13 designates a resist, numeral 14 designates a buried metal layer comprising a metal or a metallic oxide that can be selectively etched with respect to the semiconductor substrate 1 in a wet etching using an appropriate etchant. For example, an amphoteric metal, such as Al or Zn, or an amphoteric metal oxide, such as ZnO, is employed.

While in the fourth embodiment the semiconductor layer 12 is buried in a region of the substrate 1 where the cavity 6 is later produced, in this fifth embodiment a metal layer 14 is buried in the substrate 1 in place of the semiconductor layer 12 and, after formation of the first electrode 2, the piezoelectric film 3, and the second electrode 4, the metal layer 14 is selectively etched and removed to produce the cavity 6.

Figure 7:
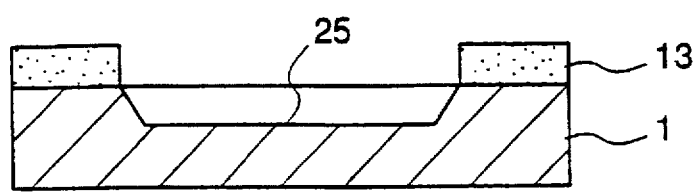
FIGS. 7(a)–7(f) are cross-sectional views illustrating process steps in a method of fabricating a thin film piezoelectric device according to a fifth embodiment of the present invention.
Figure 7:
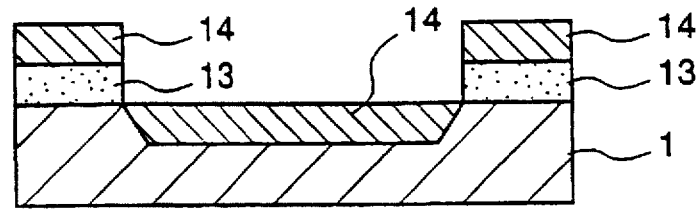
Figure 7:
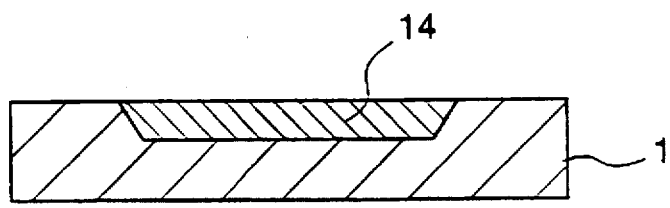
Figure 7:
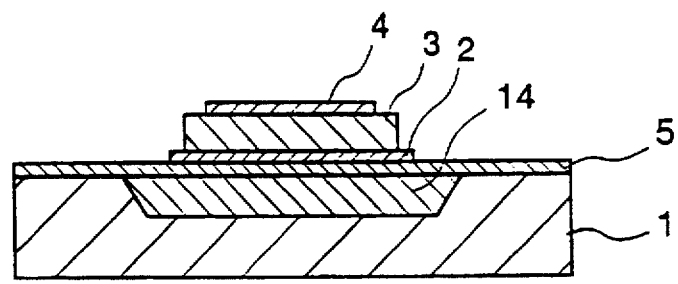
Figure 7:
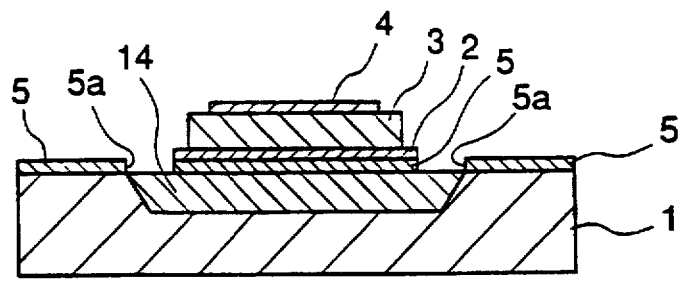
Figure 7:
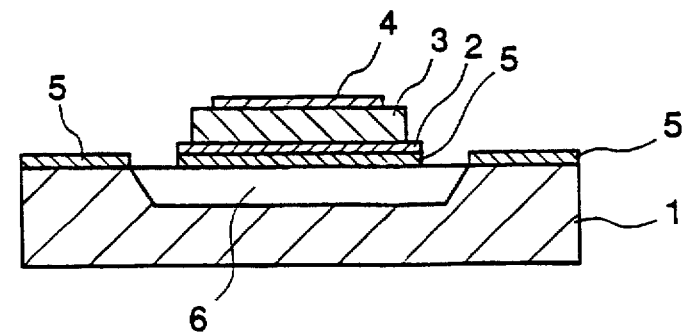

The fabricating method will be described in more detail. Initially, as illustrated in FIG. 7(a), a resist 13 about 1 μm thick is applied to the surface of the substrate 1 and patterned by conventional photolithographic techniques to form an opening opposite a region where a cavity 6 is later produced. Using the resist 13 as a mask, a portion of the substrate 1 in the region where the cavity 6 is later produced is etched and removed, forming a recess 25. The depth of the recess 25 is about 0.5 μm. The etching is carried out so that the bottom surface of the recess 25 has good morphology.

Thereafter, a layer 14 comprising a metal or a metal oxide (hereinafter referred to simply as a metal layer) is deposited on the substrate 1 by vacuum evaporation so that the recess 25 is filled with the metal layer 14, in other words, the metal layer 14 is buried in the semiconductor substrate 1 (FIG. 7(b)). Although the metal layer 14 is deposited on the resist 13, it is lifted off when the resist 13 is removed (FIG. 7(c)). While the buried metal layer 14 is formed by the lift-off technique, it may be formed only in the recess 25 by selective CVD (chemical vapor deposition) using, in place of the resist mask 13, a selective growth mask as that used in the fourth embodiment of the invention.

In the step of FIG. 7(d), as in the fourth embodiment, an insulating film 5 is formed on the surface of the substrate 1 including the buried metal layer 14, and a first electrode 2, a piezoelectric film 3, and a second electrode 4 are successively formed on the insulating film 5 by sputtering or vacuum evaporation. Thereafter, portions of the insulating film 5 which are opposed to the buried metal layer 14 and are not covered with the first electrode 2 are removed by RIE, thereby forming openings 5a (FIG. 7(e)). Finally, the buried metal layer 14 is etched from the surface exposed in the openings 5a, whereby the buried metal layer 14 is selectively removed and a cavity 6 is produced (FIG. 7(f)).

In this fifth embodiment of the invention, since the buried layer 14 comprises a metal or a metal oxide that can be selectively etched with respect to the semiconductor substrate 1 by wet etching using an appropriate etchant, the buried layer 14 can be etched selectively with respect to the substrate 1. As a combination of materials that enables the selective etching, for example, when GaAs is employed for the substrate 1, an amphoteric metal, such as Al or Zn, or an amphoteric metal oxide, such as ZnO, is employed for the buried metal layer 14. In this case, the buried metal layer 14 can be selectively etched with an aqueous basic solution, such as NH$_4$OH.

As described above, according to the fifth embodiment of the invention, a portion of the substrate 1 where the cavity 6 is later produced is etched to produce the recess 25, and the metal layer 14 fills the recess 25. After formation of the first electrode 2, the piezoelectric film 3, and the second electrode 4, the metal layer 14 is selectively etched and removed with respect to the substrate 1. Therefore, the same effects as provided by the above-described fourth embodiment are achieved.

Embodiment 6

FIG. 8(a) is a plan view illustrating a thin film piezoelectric device in accordance with a sixth embodiment of the present invention, and FIGS. 8(b) and 8(c) are cross-sectional views of the device taken along lines 8b—8b and 8c—8c in FIG. 8(a), respectively. In these figures, the same reference numerals as those in FIGS. 1(a)–1(c) designate the same or corresponding parts. Reference numeral 15 designates through-holes penetrating through the second electrode 4, the piezoelectric film 3, the first electrode 2, and the insulating film 5. In this embodiment, nine through-holes 15, each having a diameter of about 1 μm, are arranged at intervals of 10 μm.

Figure 9:
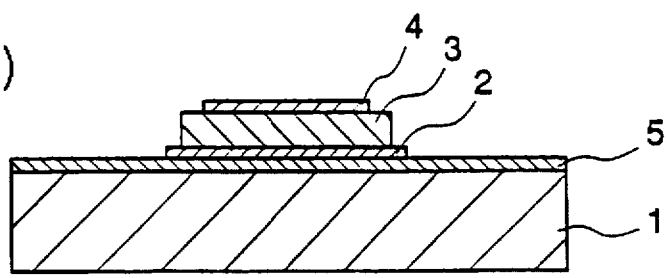
FIGS. 9(a)–9(c) are cross-sectional views illustrating process steps in a method of fabricating the thin film piezoelectric device according to the sixth embodiment of the invention.
Figure 9:
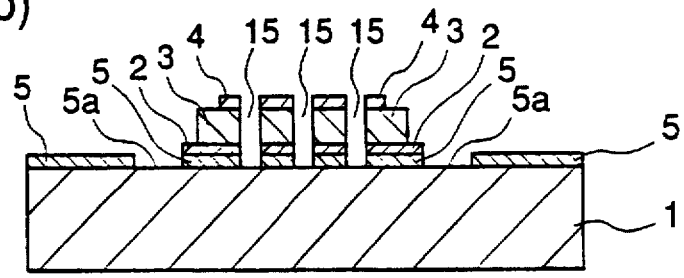
Figure 9:
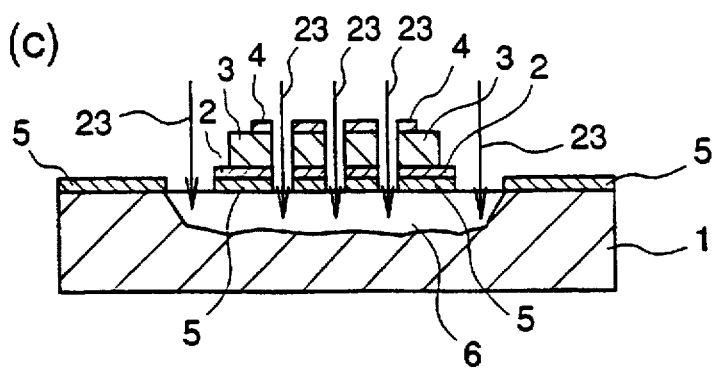

FIGS. 9(a)-9(c) are cross-sectional views illustrating process steps in a method of fabricating the thin film piezoelectric device according to the sixth embodiment of the invention. In the figures, the same reference numerals as those in FIGS. 8(a)-8(c) designate the same or corresponding parts. Reference numeral 23 denotes etching.

A description is given of the fabricating method. Initially, an insulating film 5 is formed on the semiconductor substrate 1 by CVD or sputtering. Thereafter, a first electrode 2 is formed on a region of the insulating film 5 by vacuum evaporation or sputtering and, subsequently, a piezoelectric film 3 and a second electrode 4 are formed on the first electrode 2 in this order by vacuum evaporation or sputtering (FIG. 9(a)).

Next, a resist (not shown) is applied to the entire surface of the substrate 1, and patterned by conventional photolithographic techniques to form a plurality of openings, each having a diameter of about 1 μm, within a region of the resist opposite the second electrode 4. Using the resist as a mask, the second electrode 4 is dry-etched, the piezoelectric film 3 is etched with a hydrochloric acid based etchant, the first electrode 2 is dry-etched, and the insulating film 5 is etched by RIE, thereby forming through-holes 15 (FIG. 9(b)). After removal of the resist, portions of the insulating film 5 in the proximity of the first electrode 2 are removed by RIE using a resist mask (not shown) to form openings 5a. The openings 5a may be formed before the formation of the first electrode 2.

Finally, the surface of the substrate 1 under the first electrode 2 is etched through the openings 5a of the insulating film 5 and through the through-holes 15, thereby producing a cavity 6 (FIG. 9(c)) When the substrate 1 comprises GaAs, wet etching using a mixture of tartaric acid and hydrogen peroxide is employed.

Figure 13:
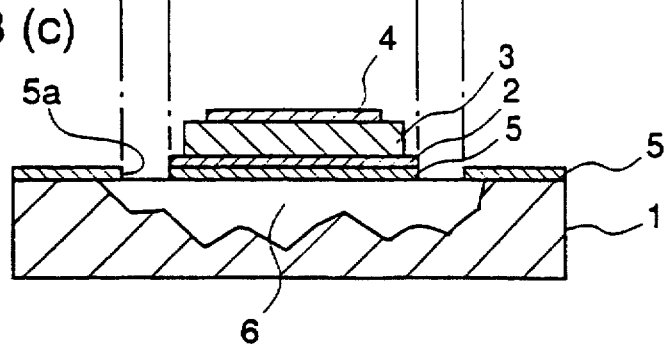
FIGS. 13(a)–13(c) are diagrams illustrating a thin film piezoelectric device according to the prior art.
Figure 13:
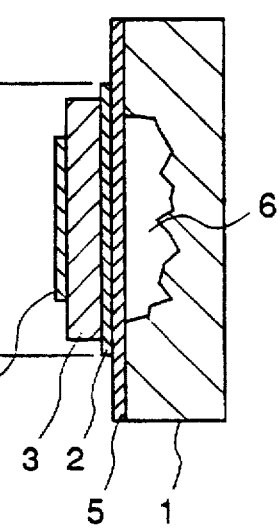
Figure 13:
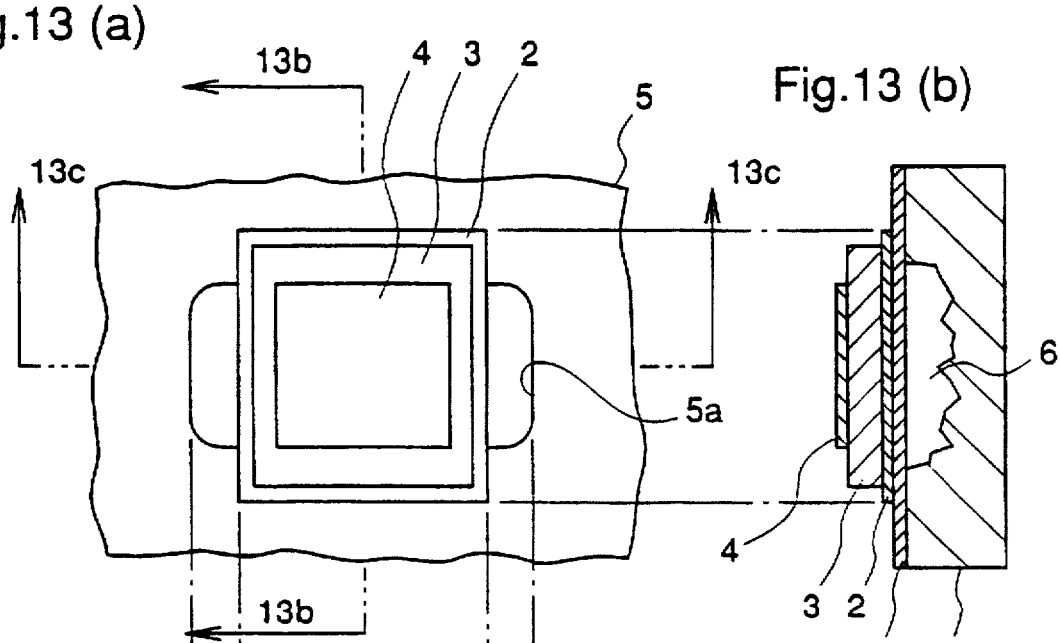
Figure 14:
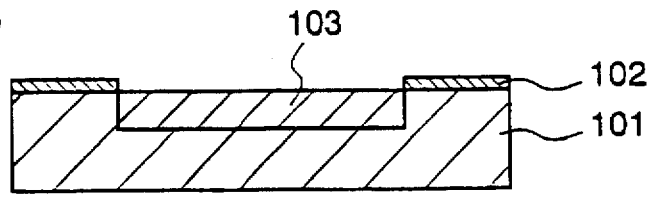
FIGS. 14(a)–14(d) are cross-sectional views illustrating process steps in a method of fabricating the piezoelectric device shown in FIGS. 13(a)–13(c).
Figure 14:
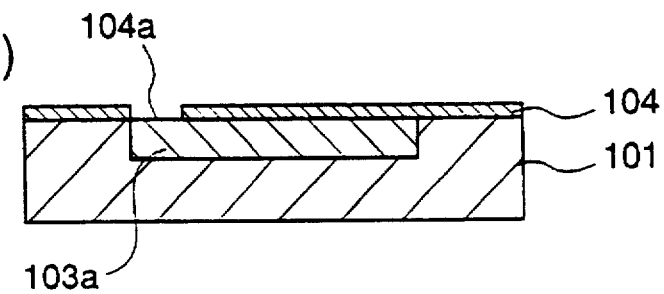
Figure 14:
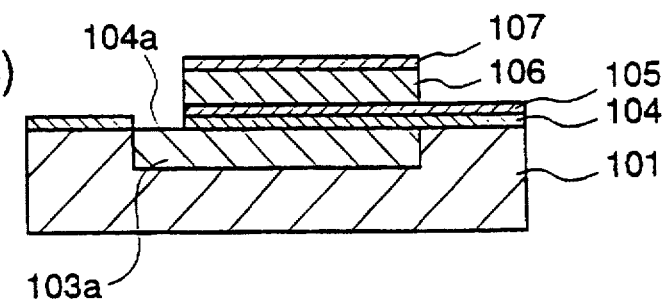
Figure 14:
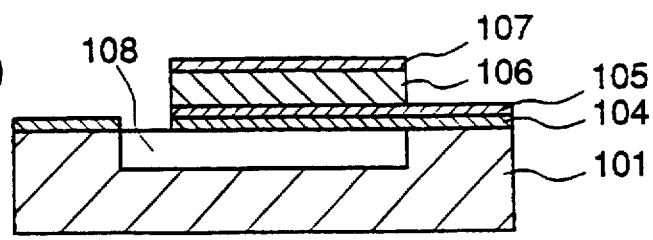

In the fabricating method of a thin film piezoelectric device according to this sixth embodiment of the invention, the etching for forming the cavity 6 in a region of the substrate under the second electrode 4 is carried out through the openings 5a which are formed in the insulating film 5 and adjacent to the first electrode 2 as in the prior art fabricating method shown in FIGS. 13(a)-13(b) and through the through-holes 15 which are formed within a region where the second electrode 4 is disposed. Therefore, the time required for the formation of the cavity 6 is significantly reduced, as compared with the prior art method in which the cavity 6 is formed by side-etching of the substrate 1 in the direction parallel to the surface of the substrate 1 only through the openings 5a adjacent to the first electrode 2.

Furthermore, since the surface of the substrate 1 is etched through a plurality of through-holes 15, the variation in the etching depth within the region opposite the first electrode 2 is reduced, resulting in a cavity 6 having a uniform depth.

In the prior art fabricating method, when the substrate is etched to form the cavity 6, since side etching proceeds in the region under the first electrode 2 as well as in the region other than the region under the first electrode 2, it is difficult to control the size of the cavity 6 in the direction parallel to the surface of the substrate 1, i.e., the horizontal direction, resulting in an increase in the size of the cavity in the horizontal direction. Such a cavity increased in the horizontal direction makes it difficult to produce devices, other than thin film piezoelectric devices, in the vicinity of the thin film piezoelectric device. On the other hand, in this sixth embodiment of the invention, since the etching time is reduced and the side etching through the openings 5a is reduced, the controllability of the cavity size in the horizontal direction of the substrate 1 is improved, resulting in a reduction in the cavity size in the horizontal direction.

The resonance frequency of the thin film piezoelectric device depends on the thickness of the piezoelectric film 3, and it hardly depends on the area of the region where the second electrode 4, the piezoelectric film 3, and the first electrode 2 overlap. Therefore, even when the through-holes 15 penetrate through the piezoelectric film 3, a thin film piezoelectric device having desired characteristics is realized.

As described above, according to the sixth embodiment of the present invention, the insulating film 5 is formed on the semiconductor substrate 1, and the first electrode 2, the piezoelectric film 3, and the second electrode 4 are formed in this order on a region of the insulating film 5. Thereafter, the through-holes 5 are formed penetrating through the second electrode 4, the piezoelectric film 3, the first electrode 2, and the insulating film 5, followed by etching of the substrate 1 through these through-holes 15. Therefore, a cavity having a uniform depth is produced in a short time. Further, the size of the cavity in the direction parallel to the surface of the substrate is reduced.

Although in this sixth embodiment the openings 5a are formed in the insulating film 5, the openings 5a may be dispensed with, in other words, the cavity 6 may be formed by etching the substrate only through the through-holes 15. Also in this case, the same effects as described above are achieved.

In this sixth embodiment nine through-holes 15 each having a diameter of about 1 μm are arranged at intervals of about 10 μm. However, the number, the diameter, and the location of the through-holes are not restricted thereto as long as the through-holes provide a sufficient etching rate and a cavity having a uniform depth.

Embodiment 7

FIGS. 10(a)-10(e) are cross-sectional views illustrating process steps in a method of fabricating a thin film piezoelectric device in accordance with a seventh embodiment of the present invention. In these figures, the same reference numerals as those in FIGS. 2(a)-2(c) designate the same or corresponding parts. Reference numerals 5b and 5c designate openings in the insulating film 5, and reference numeral 24 designates a resist. FIGS. 11(a) and 11(b) are plan views illustrating process steps in the fabricating method according to the seventh embodiment of the invention. In these figures, the same reference numerals as those in FIGS. 10(a)-10(e) designate the same or corresponding parts.

A description is given of the fabricating method. Initially, an insulating film 5 is formed on the semiconductor substrate 1 by CVD or sputtering. Then, a first electrode 2 is formed on a region of the insulating film 5 by vacuum evaporation or sputtering and, subsequently, a piezoelectric film 3 and a second electrode 4 are formed in this order on the first electrode 2 by vacuum evaporation or sputtering (FIG. 10(a)).

Thereafter, the insulating film 5, the first electrode 2, the piezoelectric film 3, and the second electrode 4 are covered with a resist (not shown), and the resist is patterned by conventional photolithographic techniques to form openings in two regions which are adjacent to the first electrode 2 and opposed to each other with the first electrode 2 between them. Using the resist as a mask, portions of the insulating film 5 are removed by RIE to form two openings 5b and 5c which are opposed to each other with the first electrode 2 between them (FIGS. 10(b) and 11(a)).

Figure 10:
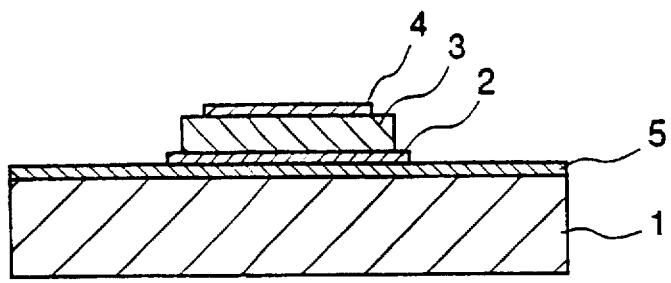
FIGS. 10(a)–10(e) are cross-sectional views illustrating process steps in a method of fabricating a thin film piezoelectric device according to a seventh embodiment of the present invention.
Figure 10:
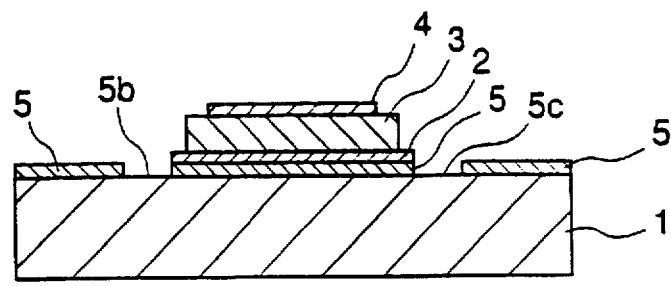
Figure 10:
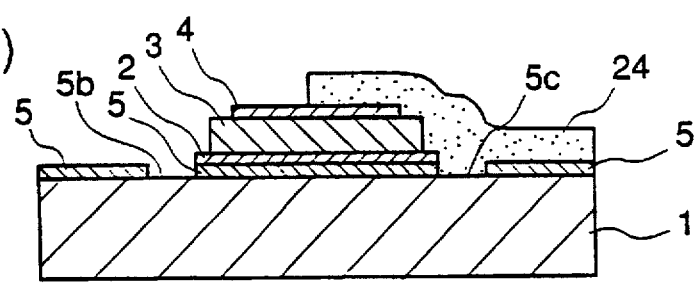
Figure 10:
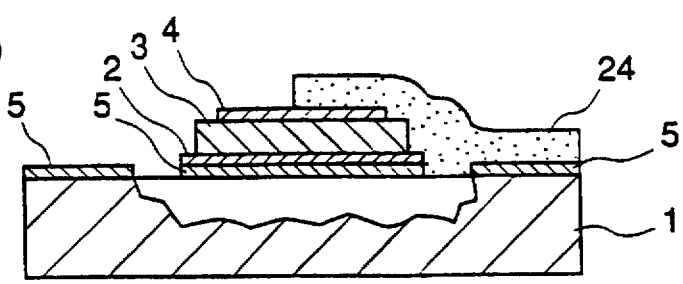
Figure 10:
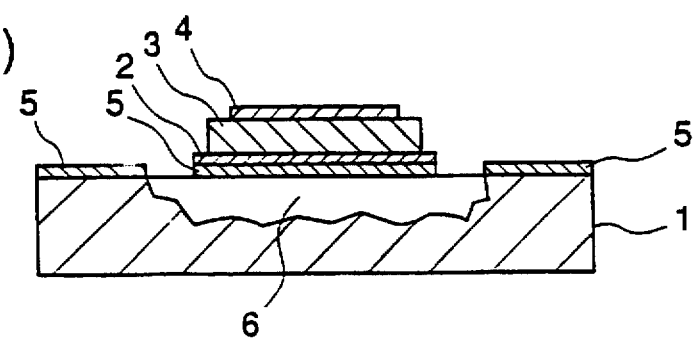
Figure 11:
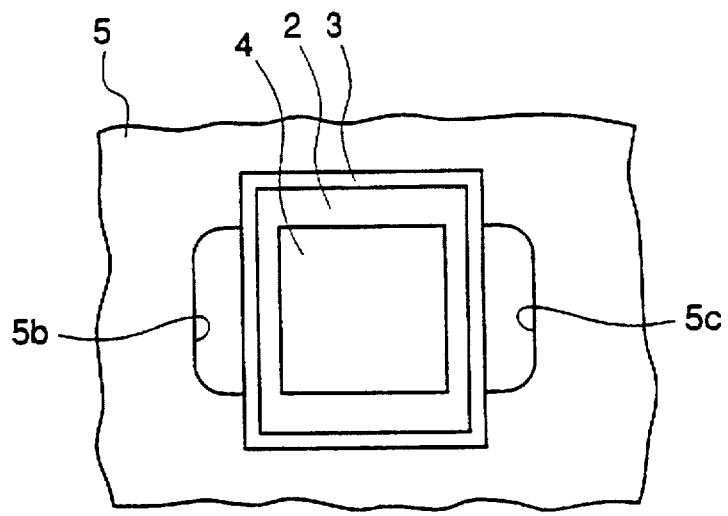
FIGS. 11(a)–11(b) are plan views illustrating process steps in the method of fabricating a thin film piezoelectric device according to the seventh embodiment of the invention.
Figure 11:
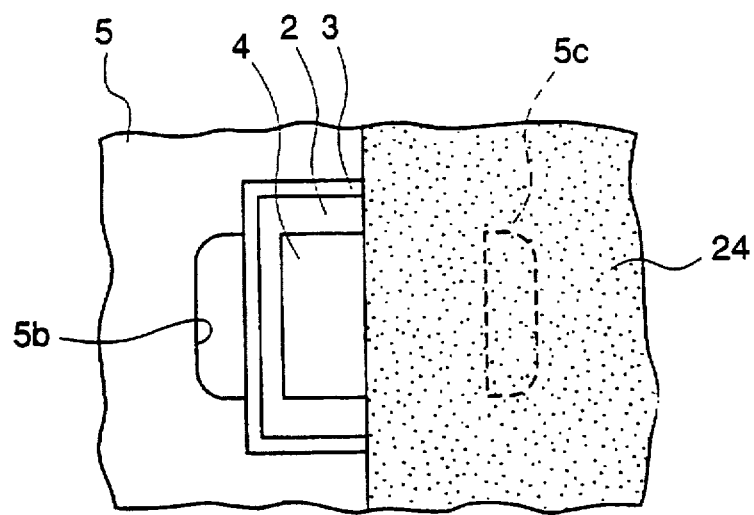
Figure 12:
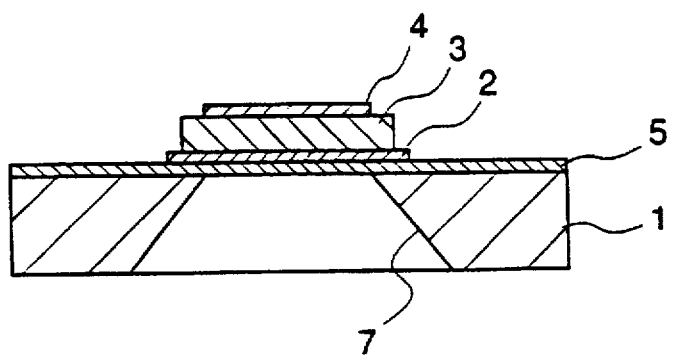
FIG. 12 is a cross-sectional view illustrating a thin film piezoelectric device according to the prior art.

After removal of the resist, another resist 24 is formed covering one of the openings 5b and 5c (in this embodiment, the opening 5c) as shown in FIGS. 10(c) and 11(b), and the semiconductor substrate 1 is etched through the opening 5b to form cavity 6 as shown in FIG. 10(d). Then, the resist 24 is removed and the completion of the etching of the cavity 6 is confirmed by detecting whether the etching front has reached the substrate 1 in the opening 5c (FIG. 10(e)). That is, when the cavity 6 is completed, it is detected, i.e., visible in the opening 5c. If the cavity 6 is incomplete, it is not detected in the opening 5c.

In the prior art method of fabricating the thin film piezoelectric device shown in FIGS. 13(a)–13(c), since the etching of the substrate 1 is started simultaneously through the two openings 5a of the insulating film 5, the etching is completed under the first electrode 2, so that it is difficult to confirm whether the cavity 6 is completely formed. In this seventh embodiment of the invention, however, the two openings 5b and 5c which are opposed to each other with the first electrode 2 between them are formed in the insulating film 5, and the substrate 1 is etched through one of the openings 5b and 5c while the other is covered with the resist 24. Therefore, the completion of the cavity 6 under the first electrode 2 can be confirmed by detecting that the etching has reached the opening that is covered with the resist 24.

As described above, according to the seventh embodiment of the present invention, the insulating film 5 is formed on the semiconductor substrate 1, and the first electrode 1, the piezoelectric film 3, and the second electrode 4 are formed on a prescribed region of the insulating film. Thereafter, the openings 5b and 5c are formed in the insulating film 5 so that they are opposed to each other with the first electrode 2 between them, and the substrate 1 is etched through one of the openings 5b and 5c while the other is covered with the resist 24. After the etching, the resist 24 is removed and completion of the etching is detected in the opening that was covered with the resist 24. Therefore, the completion of the cavity 6 is easily confirmed.

While in this seventh embodiment the cavity 6 is formed by non-selective etching, the method according to this seventh embodiment may be applied to the second to fifth embodiments in which the cavity 6 is formed by selective etching. Also in this case, the same effects as provided by the seventh embodiment are obtained in those embodiments.

While in this seventh embodiment two openings 5b and 5c are formed in the insulating film 5 and the substrate is etched through one of these openings, the method according to this seventh embodiment may be applied to the sixth embodiment in which a plurality of through-holes 15 are produced. In this case, the etching to produce the cavity is performed with masking, using a resist, and one of the through-holes and openings of the insulating film that is the most distant from the adjacent through-hole or opening. After the etching, the resist is removed and the completion of the cavity is confirmed by detecting whether the etching front reaches the substrate in the through-hole or the opening that was covered with the resist.

In the second to seventh embodiments of the invention, emphasis has been placed upon a method of fabricating a thin film piezoelectric device including an insulating film on a semiconductor substrate. However, the present invention may be applied to a thin film piezoelectric device including no insulating film on a semiconductor substrate. In this case, when the etching for making a cavity in the substrate is performed, an etching mask comprising a resist or an insulating film is formed on the substrate. Also in this case, the same effects as provided by the second to seventh embodiments are obtained.

What is claimed is:

1. A method of fabricating a thin film piezoelectric device comprising:

preparing a semiconductor substrate having a surface;

forming an etch stopping layer having an etching rate on the surface of the semiconductor substrate;

forming a first semiconductor layer having an etching rate higher than the etching rate of the etch stopping layer on the etch stopping layer;

forming a first electrode on a region of the first semiconductor layer;

forming a piezoelectric film on the first electrode;

forming a second electrode on the piezoelectric film; and etching a portion of the first semiconductor layer opposite where the first electrode, the piezoelectric film, and the second electrode overlap, from the surface of the first semiconductor layer and selectively with respect to the etch stopping layer, thereby forming a cavity in the first semiconductor layer.

2. The method of claim 1 further including:

after formation of the first semiconductor layer, forming an insulating film on the first semiconductor layer;

forming openings in the insulating film at regions adjacent to the first electrode; and etching the first semiconductor layer from the surface exposed in the openings in the insulating film.

* * * * *